United States Patent [19]

Stenger et al.

[11] Patent Number: 6,080,341
[45] Date of Patent: Jun. 27, 2000

[54] PROCESS FOR MAKING AN INDIUM-TIN-OXIDE SHAPED BODY

[75] Inventors: Bernd Stenger, Hammersbach; Marek Gorywoda, Hanau; David Francis Lupton, Gelnhausen; Wolfram Graf, Essen; Wolfgang Jablonski, Mettmann, all of Germany

[73] Assignee: W.C. Heraeus GmbH & Co. KG, Hanau, Germany

[21] Appl. No.: 09/310,310

[22] Filed: May 12, 1999

[30] Foreign Application Priority Data

May 20, 1998 [DE] Germany .......................... 198 22 570

[51] Int. Cl.$^7$ .................................................. C04B 35/64
[52] U.S. Cl. ................ 264/6; 264/12; 264/604; 264/667; 264/681
[58] Field of Search ................ 264/6, 12, 604, 264/667, 681

[56] References Cited

U.S. PATENT DOCUMENTS

| | | | |
|---|---|---|---|
| 4,250,610 | 2/1981 | Wilbers et al. | 29/424 |
| 5,094,787 | 3/1992 | Nakajima et al. | 264/65 |
| 5,401,701 | 3/1995 | Ogawa et al. | 501/134 |
| 5,433,901 | 7/1995 | Rancoule et al. | 264/28 |
| 5,435,826 | 7/1995 | Sakakibara et al. | 75/232 |
| 5,531,948 | 7/1996 | Schlott et al. | 264/122 |
| 5,762,768 | 6/1998 | Goy et al. | 204/298.13 |
| 5,763,091 | 6/1998 | Kawata et al. | 428/428 |
| 5,772,924 | 6/1998 | Hayashi et al. | 252/520.1 |
| 5,846,288 | 11/1998 | Jost et al. | 75/252 |
| 5,861,132 | 1/1999 | Pratsinis et al. | 423/613 |
| 5,866,493 | 2/1999 | Lee et al. | 501/134 |
| 5,972,527 | 10/1999 | Kaijou et al. | 428/697 |
| 5,980,815 | 11/1999 | Matsunaga et al. | 264/681 |
| 5,984,997 | 11/1999 | Jost et al. | 75/252 |

FOREIGN PATENT DOCUMENTS

| | | |
|---|---|---|
| 2939634 | 7/1980 | Germany . |
| 44 13 344 | 10/1995 | Germany . |
| 5170513 | 7/1993 | Japan . |
| WO 97/31739 | 9/1997 | WIPO . |

OTHER PUBLICATIONS

*Patent Abstracts of Japan*, vol. 017, No. 577 (C–1122), Oct. 20, 1993 of JP 05 170513, Jul. 9, 1993.
*Derwent Abstracts,* AN 93–2252544, XP002112571 of JP 5 170513, Jul. 9, 1993.

*Primary Examiner*—Daniel J. Jenkins
*Attorney, Agent, or Firm*—Frishauf, Holtz, Goodman, Langer & Chick, P.C.

[57] ABSTRACT

A process for making an indium-tin-oxide shaped body, comprising: (a) filling an indium-tin-oxide powder into a first flexible mold, the indium-tin-oxide powder having a specific BET surface of at most 3 m$^2$/g with a mean primary particle size of 0.03 $\mu$m to 1.0 $\mu$m and/or having a density of at least 40% of theoretical density after cold pressing at a pressure of 100 MPa and/or the indium-tin-oxide powder being made by reacting at least two reaction partners comprising a molten indium-tin-metal alloy as a first reaction partner and oxygen as a second reaction partner in a plasma arc in a plasma chamber provided with an inlet opening for the reaction partners and an outlet with a gas-supply device to obtain a material, and quenching the material at the outlet opening of the plasma chamber with a gas stream which cools the material at a cooling rate of 10$^5$ K/s to 10$^8$ K/s to +50° C. to +400° C.; (b) cold pressing the indium-tin-oxide powder at a minimum pressure of 100 MPa; (c) placing the cold compact released from the first mold in a ceramic powder in a second mold, the ceramic powder having a maximum particle diameter of 250 $\mu$m, and a melting point and a sintering temperature higher than +800° C., the melting point of the second mold being higher than 800° C. and the second mold being ductile under the conditions of a hot isostatic pressing; (d) sealing the second mold in a gastight manner; and (e) subjecting the wetted cold compact to hot isostatic pressing at a minimum temperature of +800° C. and a minimum pressure of 20 MPa.

17 Claims, No Drawings

PROCESS FOR MAKING AN INDIUM-TIN-OXIDE SHAPED BODY

BACKGROUND OF THE INVENTION

1. Field of the Invention

The present invention relates to a process for making an indium-tin-oxide (ITO) shaped body, to such a shaped body and to the use of such a shaped body.

2. Background Information

WO 97/31739 discloses among other features a process for making a pair of sputtering targets, wherein, in view of the sputtering loss, this is preformed to shape close to final shape by compaction of a metal powder between two massive plates under hot isostatic pressing conditions. The separating plates disposed on each side of an appropriate apparatus are adjacent to each other in pairs and are separated from each other by a ceramic release layer. The ceramic release layer prevents diffusion welding of the corresponding plates to each other. In this process, the powder is compacted substantially uniaxially despite hot isostatic pressing. The inhomogeneous compaction of the indium-tin-oxide (ITO) compact is therefore unfavorable.

Japanese Patent Application 5170513 discloses a process for making highly compact ITOs (indium-tin-oxide compounds), which are sintered using oxygen as the sintering atmosphere in a nickel or copper hollow vessel, the inside surface of which is coated with alumina and/or boron nitride. A disadvantage in this process is the wrinkling which occurs in the wall of the hollow vessel due to severe shrinkage of the powder filling during hot isostatic pressing.

Different coefficients of thermal expansion of the ITO and the material of the hollow-vessel wall lead to cracking and the risk of contamination of the ITO. Strong adhesion to the corresponding metal wall is also observed; both lead to cracking, and so it is not possible reliably to make predetermined dimensions and geometries for ITOs.

German Patent DE 29 39 634 C2 (U.S. Pat. No. 4,250,610 is a related family member of DE 2939634C2) relates to a process for compacting a metal casting at a high temperature under isostatic pressure ("hot isostatic pressing" or "HIP"), wherein the casting contains irregularities associated with the surface and a coating is applied on a surface of the casting in order to bridge over surface openings associated with the irregularities, after which the casting is subjected to a combination of selected processing temperature and isostatic pressure to bring about compaction. The coating comprises a ceramic material, which at a vitrification temperature lower than the selected processing temperature for compaction by the HIP yields a nonmetallic, amorphous ceramic coating which is substantially impermeable to gas. The coating therefore fuses during hot isostatic pressing.

The coefficient of thermal expansion is adapted to the coefficient of thermal expansion of the casting surface in the temperature range from room temperature up to the selected processing temperature for compaction.

At the selected processing temperature during compaction, the coating is viscous, and so the bond of the coating to the casting surface is destroyed during compaction by the HIP.

The casting surface and the ceramic material are heated to the vitrification temperature and the ceramic material vitrifies to form the ceramic coating, thus yielding a destroyable bond to the casting surface.

The coated casting is then cooled and the coated casting surface is subjected to a combination of a selected processing temperature and isostatic pressure, in order to compact the coated part of the casting and to destroy the bond between the ceramic coating and the casting surface.

Finally the casting is cooled and then the coating is removed from the surface thereof.

This hot isostatic pressing process developed especially for metal castings represents an extremely complicated and thus time-consuming and costly process, with the additional disadvantage that the viscous coating would penetrate into cold compacts made by powder metallurgy.

SUMMARY OF THE INVENTION

The foregoing inspired the object of the present invention of overcoming the aforesaid disadvantages at least partly by means of a novel method, a novel shaped body and a use. The identified object comprises in particular producing ITO shaped parts with a high density in a relatively simple way and simultaneously avoiding, at least for the most part, contamination of and/or damage to the surface of the compact, especially during hot pressing.

This object is achieved according to the process, shaped body and use according to the present invention.

In the process according to the present invention, an indium-tin-oxide (ITO) powder is initially filled into a first form.

Of decisive importance in the process according to the present invention is the use of an ITO powder which has a specific BET surface (Brunauer-Emmett-Teller) of at most 3 $m^2/g$ with a mean primary particle/crystal size (since the powder has a very strong tendency to form agglomerates, the size of the individual particles/crystal branchings is estimated with a scanning electron microscope and such size is the diameter of the primary particle/crystal size) in the range of 0.03 $\mu$m to 1.0 $\mu$m and/or a density of at least 40% of the theoretical density (the theoretical density is 7.14 $g/cm^3$) after cold pressing at a pressure of 100 MPa. Such an ITO powder has a sufficiently high bulk density and cold-pressed density that penetration into the ITO compact of the ceramic powder used in the process according to the present invention is largely prevented.

ITO powders substantially exhibiting the aforesaid present characteristics, but suitable at least for the process according to the present invention can be obtained by the following two steps:

1. Firstly at least two reaction partners are reacted in a plasma arc of a plasma chamber provided with an inlet opening for the reaction partners and an outlet opening with a gas-supply device (which can be a gas pipe with a nozzle opening), in order to obtain a material, a molten indium-tin-metal alloy being used as the first reaction partner and oxygen as the second reaction partner.

2. The material reacted in the plasma arc is then quenched at the outlet opening of the plasma chamber with a gas stream which cools the material at a cooling rate in the range of $10^5$ K/s to $10^8$ K/s to a temperature of between +50° C. and +400° C., thus forming an indium-tin solid-solution powder.

After this first process step, the ITO powder is cold-pressed at a minimum pressure of 100 MPa. Usually this is achieved in a compression chamber filled with a liquid pressurizing medium such as water or oil. In the process, the powder is compressed at a pressure of 100 MPa to a density of at least 40% of the theoretical density, in order largely to prevent penetration into the compact of ceramic powder used in the hot isostatic pressing.

Thereafter the cold compact is released from the first mold and placed in a second mold made typically of steel, in which the ceramic powder, usually alumina, is present. The maximum particle diameter is 250 µm, and both the melting point and sintering temperature are higher than +800° C. and thus above the process temperature during an isostatic hot pressing. The melting point of the second mold is also higher than +800° C. and thus above the process temperature during the hot isostatic pressing, the second mold being ductile under the conditions of hot isostatic pressing.

The second mold is then sealed in a gastight manner, for example, by welding, in order to prevent equalization of pressure between the atmosphere present in the mold and that present outside the mold during the hot isostatic pressing.

Thereafter the cold compact wetted with the ceramic powder is subjected to hot isostatic pressing at a minimum temperature of +800° C. and a minimum pressure of 20 MPa. In the process, the ITO cold compact becomes highly compressed.

Finally, after cooling, the hot compact is released from the second mold. This is usually done by carefully sawing the HIP mold. By virtue of the aforementioned favorable characteristics of the ITO powder used, penetration of the ceramic powder is largely prevented, and at the same time adhesion to the inside walls of the HIP mold is also effectively prevented.

DETAILED DESCRIPTION OF THE INVENTION

In the process for making the ITO powder, it has been proved in practice and is therefore advantageous for the gas stream to have a velocity of between 300 m/s and 500 m/s and/or for the cooling rate to be in the range of 106 K/s to 108 K/s.

It is particularly advantageous when cold pressing is performed isostatically to use a first flexible mold, in order to achieve the most homogeneous possible compaction of the powder. Ideally, the first mold should be as flexible as possible in all three spatial directions, so that the most homogeneous possible compaction of the ITO powder is ensured during the cold isostatic pressing.

Advantageously, the cold pressing is performed without a binder and/or a pressing agent, in order to ensure that an adverse loss of pressurization efficiency due to evaporation of the added agents and that contamination of the ITO powder do not occur during hot isostatic pressing.

It is also advantageous for the first flexible mold to have a rubbery consistency, in order in this way to ensure uniform size reduction in all three spatial directions during pressurization. The hot isostatic pressing mold is advantageously evacuated before hot isostatic pressing, in order to remove any residual moisture and residual gases that may be present. Moisture presumably leads during the hot isostatic pressing to decomposition of water with formation of molecular hydrogen, which leads to deformation of the HIP container and to a hydrogen explosion when this container is opened. These two disadvantages are prevented by evacuation, and simultaneously the pressurization efficiency is increased.

The shaped bodies made by the process according to the present invention exhibit the surprising and advantageous characteristics indicated hereinabove, especially relatively homogeneous surfaces.

The same advantages are also true for the shaped body made by the process according to the present invention being used as a sputtering target.

In the use of iron-containing hot isostatic molds, it is found advantageously that the shaped body has a maximum iron content of 0.001 wt % after hot isostatic pressing, meaning that iron contamination is extremely limited.

EXAMPLES

The invention will be described by means of the following non-limiting examples.

Example 1

Rectangular block:

A rubber mold with dimensions of 135×180 mm is filled with 73 kg of ITO powder, which is vibrated until the filling height reaches 760 mm. The mold is sealed airtightly and compacted in a commercial cold isostatic press at a pressure of 320 MPa. The rubber mold is removed in order to obtain a "compact" with dimensions of 128×168×697 mm. This compact has sufficient strength and stability to permit normal handling, including machining with cutting tools to correct the dimensional accuracy.

A container with inside dimensions of 150×190×750 mm is prepared from stainless-steel sheets by welding, but the cover is not welded on for the time being. A layer of fine alumina powder (mean particle size about 3 µm) is spread over the bottom of the container to a depth of about 20 mm. The cold-pressed ITO block is placed on this layer and the gap between block and inside wall of the container is uniformly filled with the alumina powder. The top side of the ITO block is also covered with alumina powder. The cover is then placed on the container and welded together with the side walls. The cover is equipped with a stainless-steel tube used as a suction nozzle for evacuation. After the cover has been welded on, the container is placed in a box furnace at 400° C. and the suction nozzle is connected to a vacuum pump in order to remove the included air and moisture adsorbed on the powder surface. Finally the suction nozzle is sealed by welding and the container placed in a hot isostatic press, which is then pressurized in known manner to a pressure of 40 MPa at a temperature of 970° C. for six hours. After cooling, the container is cut away and the block removed. This block does not adhere in any way to the wall of the container, and it retains the rectangular shape of the block obtained by cold isostatic pressing largely without cracks.

The dimensions shrink to 112×150×640 mm, however, corresponding to a density of 6.79 g/cm$^3$. The contamination with Fe is 0.0005 wt %.

Example 2

Cylindrical pipe:

A fine-ground cylindrical bar of steel (62 mm diameter× 450 mm length) is placed centrally in a rubber hose (inside diameter 90 mm) which is closed at one end. The space between the steel bar and the rubber hose is filled with 6 kg of ITO powder and the hose is closed at the top end. The closed hose is then subjected to a cold isostatic pressing similar to that as in Example 1. The hose is then opened and the bar is carefully removed to obtain the ITO shaped body in the form of a pipe (inside diameter approximately 62 mm, outside diameter approximately 86 mm).

The pipe is placed in a steel container (see Example 1) and is packed inside and outside with the alumina powder as mentioned hereinabove. After evacuation and hot isostatic pressing (in a manner similar to that as in Example 1), a pipe with the following approximate dimensions is obtained:

Inside diameter 60 mm, outside diameter 80 mm, length 400 mm.

The compact is finish-ground inside, outside and at the ends, for which purpose only a small amount corresponding to one to two millimeters must be removed, in order to obtain a clean surface free of alumina and the desired hollow-cylindrical geometry.

In principle, shaped bodies of different geometry can be obtained by grinding the obtained hot compact.

It will be appreciated that the instant specification is set forth by way of illustration and not limitation and that various modifications and changes may be made without departing from the spirit and scope of the present invention.

What is claimed is:

1. A process for making an indium-tin-oxide shaped body, comprising:
    (a) filling an indium-tin-oxide powder into a first mold, the indium-tin-oxide powder having properties selected from the group consisting of at least one of (i) a specific BET surface of at most 3 m²/g with a mean primary particle size of 0.03 μm to 1.0 μm, (ii) a density of at least 40% of theoretical density after cold pressing at a pressure of 100 MPa, and (iii) properties of the indium-tin-oxide powder provided by making the indium-tin-oxide powder by a process comprising:
    reacting at least two reaction partners comprising a molten indium-tin-metal alloy as a first reaction partner and oxygen as a second reaction partner in a plasma arc in a plasma chamber provided with an inlet opening for the reaction partners and an outlet with a gas-supply device, in order to obtain a material, and
    quenching said material at the outlet opening of the plasma chamber with a gas stream which cools the material at a cooling rate of $10^5$ K/s to $10^8$ K/s to a temperature of +50° C. to +400° C., thus forming an indium-tin solid-solution powder;
    (b) cold pressing the indium-tin-oxide powder from step (a) at a minimum pressure of 100 MPa to obtain a cold compact and releasing the cold compact from the first mold;
    (c) placing the cold compact released from the first mold in a ceramic powder, which is present in a second mold, the ceramic powder having a maximum particle diameter of 250 μm, a melting point higher than +800° C. and a sintering temperature higher than +800° C., the melting point of the second mold having a melting temperature higher than 800° C. and the second mold being ductile under conditions of a hot isostatic pressing;
    (d) sealing the second mold in a tight manner; and
    (e) subjecting the resultant cold compact wetted with the ceramic powder to a hot isostatic pressing at a minimum temperature of +800° C. and a minimum pressure of 20 MPa.

2. The process according to claim 1, wherein the gas stream has a velocity of 300 m/s to 500 m/s.

3. The process according to claim 1, wherein the cooling rate is $10^6$ K/s to $10^8$ K/s.

4. The process according to claim 1, wherein the cold pressing is preformed isostatically and the first mold is a flexible mold.

5. The process according to claim 1, wherein the cold pressing is performed without at least one substance selected from the group consisting of a binder and a pressing agent.

6. The process according to claim 4, wherein the first mold which is flexible has a rubbery consistency.

7. The process according to claim 1, which further comprises that the second mold is evacuated before the hot isostatic pressing.

8. The process according to claim 1, wherein the ceramic powder is alumina.

9. The process according to claim 1, wherein the sealing of the second mold in a gas tight manner is carried out by welding together the second mold.

10. The process according to claim 1, wherein the second mold is an iron-containing mold.

11. The process according to claim 2, wherein the cooling rate is $10^6$ K/s to $10^8$ K/s.

12. The process according to claim 11, wherein the cold pressing is performed isostatically and the first mold is a flexible mold; the cold pressing is performed without a binder or a pressing agent; and the first mold has a rubbery consistency.

13. The process according to claim 12, wherein the ceramic powder is alumina and which further comprises that the second mold is evacuated before the hot isostatic pressing.

14. An indium-tin-oxide shaped body, which is made by the process according to claim 1.

15. The indium-tin-oxide shaped body according to claim 14, wherein the second mold is an iron-containing mold and the shaped body has a maximum iron content of 0.001 wt % after the hot isostatic pressing.

16. In a sputtering target, wherein the improvement comprises the sputtering target being made of the shaped body made by the process according to claim 1.

17. In a sputtering target, wherein the improvement comprises the sputtering target being made of the shaped body made by the process according to claim 15.

* * * * *